United States Patent
Chin et al.

(10) Patent No.: US 7,218,518 B2
(45) Date of Patent: May 15, 2007

(54) HEAT DISSIPATION DEVICE WITH HEAT PIPES

(75) Inventors: Hsiang-Jung Chin, Kaohsiung (TW); Hung-Chou Chan, Changhua (TW); Wen-Liang Huang, Hsinchuang (TW); Chao-Jung Chen, Taipei (TW)

(73) Assignee: Quanta Computer Inc., Tao Yuan Shien (TW)

( * ) Notice: Subject to any disclaimer, the term of this patent is extended or adjusted under 35 U.S.C. 154(b) by 275 days.

(21) Appl. No.: 10/983,609

(22) Filed: Nov. 9, 2004

(65) Prior Publication Data

US 2005/0201058 A1    Sep. 15, 2005

(30) Foreign Application Priority Data

Mar. 10, 2004   (TW) ............................. 93106395 A

(51) Int. Cl.
*H05K 7/20* (2006.01)
(52) U.S. Cl. .................. 361/697; 165/104.33; 361/700
(58) Field of Classification Search ........... 165/104.33; 361/697, 700
See application file for complete search history.

(56) References Cited

U.S. PATENT DOCUMENTS 6,779,595 B1 * 8/2004 Chiang .................. 165/104.33
6,785,104 B2 * 8/2004 Tallman et al. ................ 361/42
6,894,900 B2 * 5/2005 Malone ...................... 361/700

FOREIGN PATENT DOCUMENTS

| CN | 2514401 Y | 10/2002 |
|---|---|---|
| TW | 551800 | 9/2003 |

* cited by examiner

*Primary Examiner*—Greg Thompson
(74) *Attorney, Agent, or Firm*—Rabin & Berdo, PC

(57) ABSTRACT

A heat dissipation device with heat pipes is described. The heat dissipation device has at least one L-shaped heat pipe, a plurality of heat fins, and a heat sink base. One end of the L-shaped heat pipe is coupled to one heat pipe fixing trench of the heat sink base so as to increase a contact area for transmitting heat and therefore improve a heat dissipation efficiency thereof. The heat fins includes at least one upper heat fin and at least one lower heat fin to couple to the L-shaped heat pipe via a round opening and a long opening respectively. The heat dissipation device therefore reduces a volume thereof and save an occupation space in an electrical device.

20 Claims, 2 Drawing Sheets

HEAT DISSIPATION DEVICE WITH HEAT PIPES

RELATED APPLICATIONS

The present application is based on, and claims priority from, Taiwan Application Serial Number 93106395, filed on Mar. 10, 2004, the disclosure of which is hereby incorporated by reference herein in its entirety.

FIELD OF THE INVENTION

The present invention relates to a heat dissipation device, and more particularly, to a heat dissipation device with L-shaped heat pipes.

BACKGROUND OF THE INVENTION

Information technology and the computer industry are highly developed now. Because computers have powerful calculation capability and can deal with a great amount of digital data, computers are popularly used in myriad applications. With progress in semiconductor manufacturing processes and semiconductor functions, electronic circuit layout of semiconductors has become increasingly complicated and sophisticated.

For example, an electronic circuit layout of a new generation central processing unit (CPU) is more complicated than that of an old one because the new generation CPU has to provide more powerful functions for users and application software. The new generation CPU provides powerful functionality and performance but also generates new problems in use. One serious problem is that the new generation CPU, with its more complicated circuitry, has higher power consumption and thus has a higher working temperature. The higher working temperature can cause instability in an operating system of the computer. In general, a lower working temperature makes a computer more stable. That is to say, if the computer working temperature can be kept lower, the performance thereof will be higher. On the contrary, if the computer working temperature is too high, the performance and stability will decrease and the operating system may even crash in some extreme situations.

Conventionally, a heat dissipation device is mounted on a new generation CPU having high power consumption to exhaust directly the heat generated by the CPU. The fan of the heat dissipation device blows on the heat fins of the heat dissipation device mounted on the CPU to exhaust the heat out of the computer. For effective exhausting, a conventional heat dissipation device utilizes heat pipes to transmit the heat to the heat fins, and the heat is then removed from the computer.

As the heat generated by the new generation CPU increases, computers need a heat dissipation device with high heat dissipating efficiency to remove the heat. However, the heat dissipation devices with high heat dissipating efficiency usually have large size, which is not suitable for new generation computers, since they are constantly decreasing in volume.

SUMMARY OF THE INVENTION

One objective of the present invention is to utilize an L-shaped heat pipe to increase a heat dissipation efficiency of a heat dissipation device for reducing a temperature of a CPU.

Another objective of the present invention is to utilize an L-shaped heat pipe to increase a heat dissipation efficiency of a heat dissipation device so as to reduce the volume of the heat dissipation device.

The present invention provides a heat dissipation device to remove heat generated by a heat source, and particularly to remove heat generated by an integrated circuit such as, for example, a central processing unit of a computer. The heat dissipation device includes a base, at least one L-shaped heat pipe, and a plurality of heat fins. The L-shaped heat pipe is coupled to a heat pipe fixing trench of the base to increase a heat transmitting area for enhancing a heat dissipation efficiency of the heat dissipation device. The heat generated by the heat source is absorbed by the base and subsequently transmitted to the heat fins via the L-shaped heat pipe to remove the heat from the heat dissipation device.

The heat fins further includes upper heat fins and lower heat fins. The upper heat fin utilizes a round opening for the L-shaped heat pipe to pass through and the lower heat fin utilizes a long opening for the L-shaped corner of the L-shaped heat pipe to pass through. The long opening is a rectangular opening or an oblong opening for the heat pipe to pass easily through.

The L-shaped heat pipe, the base, and the heat fins are made of a metal material with high thermal conductivity such as, for example, aluminum or copper.

The L-shaped heat pipe increases a contact area for transmitting heat between the base and the L-shaped heat pipe so that the heat generated by the heat source can be easily transmitted to the heat fins via the L-shaped heat pipe and removed therefrom. Hence, the heat dissipation device according to the present invention can effectively increase heat dissipation efficiency and the volume thereof is reduced to save a required occupation space in an electrical device.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1:
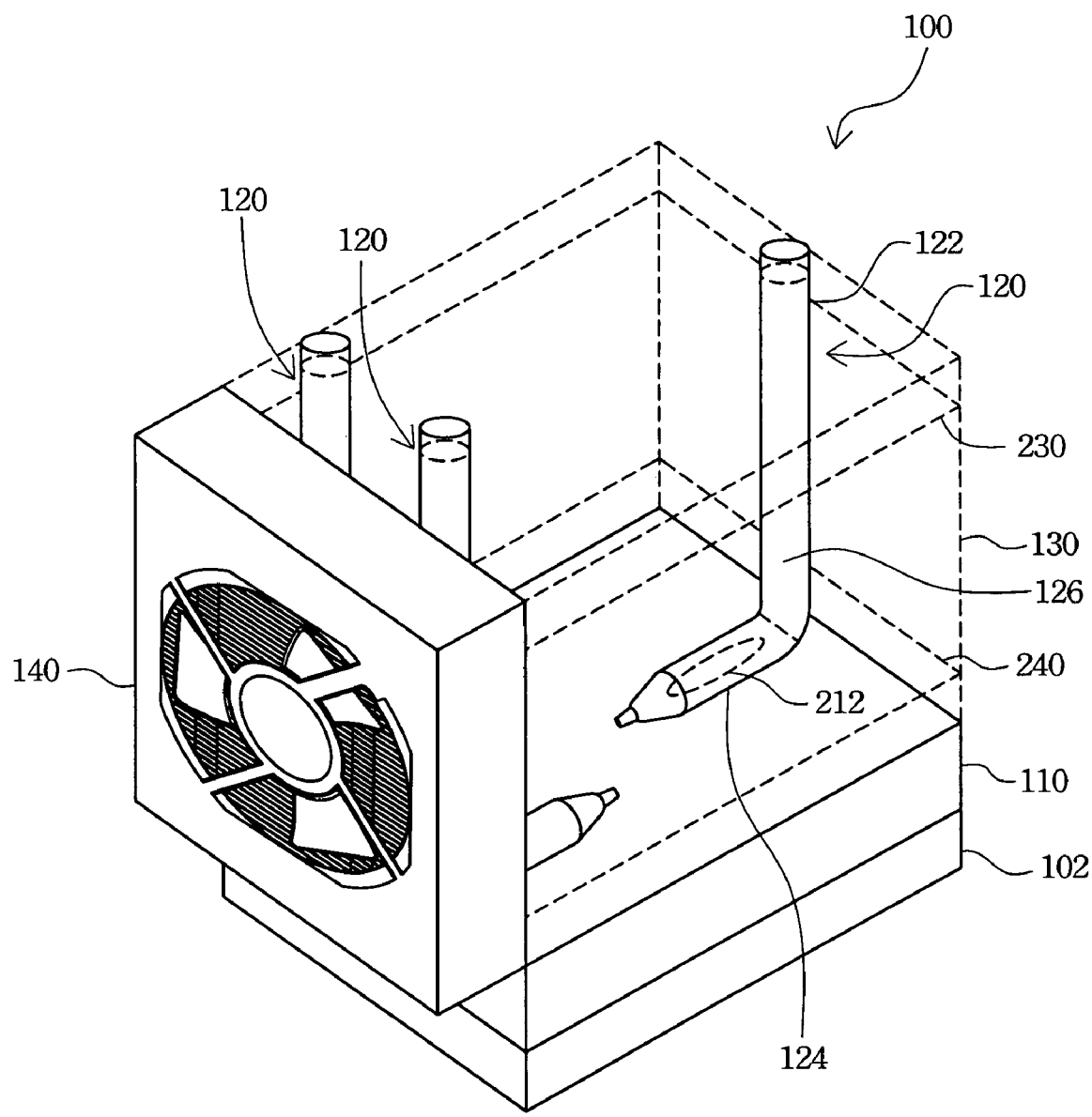
FIG. 1 is a schematic view of a preferred embodiment of a heat dissipation device with L-shaped heat pipes according to the present invention.

FIG. 1 is a schematic view of a preferred embodiment of a heat dissipation device with L-shaped heat pipes according to the present invention. The heat dissipation device 100 has a base 110, L-shaped heat pipes 120 and a plurality of heat fins 130. The L-shaped heat pipes 120 and the heat fins 130 are configured on the base 110, and the heat fins 130 are coupled to the L-shaped heat pipes 120. An under surface of the base 110 couples to a central processing unit (CPU) 102 or any other heat source to absorb heat generated therefrom and transmit the heat to the heat fins 130 disposed parallel to the base 110 via the L-shaped heat pipe 120. Then, a fan 140 disposed beside the heat dissipation device 100 blows air on the heat fins 130 to take the heat out.

The heat dissipation device 100 utilizes at least one L-shaped heat pipe 120 to transmit the heat. The L-shaped heat pipe 120 is composed of a standing portion 122, a transverse portion 124, and an L-shaped corner 126 connected therebetween. The L-shaped heat pipe 120 is preferably made of a material with a high thermal conductivity such as, for example, aluminum or copper. Compared with a conventional heat pipe, the L-shaped heat pipe 120 utilizes the transverse portion 124 coupled and connected to the base 110 so as to absorb more heat from the base 110 and the heat is subsequently transmitted to the heat fins 130 via the standing portion 122 of the L-shaped heat pipe 120. Therefore, the heat can quickly and uniformly be transmitted to the heat fins 130. Accordingly, the heat dissipation efficiency of the heat dissipation device 100 is improved. And each of the heat fins 130 can uniformly and adequately dissipate the heat so as to reduce effectively the size of the heat fins 130.

Additionally, due to the L-shaped heat pipe 120 absorbing more heat from the base 110, comparing with a conventional heat pipe, the L-shaped heat pipe 120 can transmit more heat to the heat fins 130. The heat dissipation device 100 has a higher heat dissipating efficiency and occupies a smaller area than a conventional heat dissipation device.

Figure 2A:
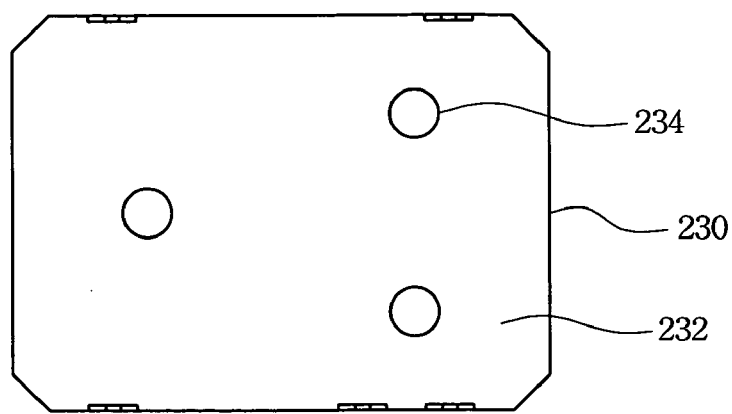
FIG. 2A is a schematic top view of an upper heat fin of the preferred embodiment of FIG. 1.
Figure 2B:
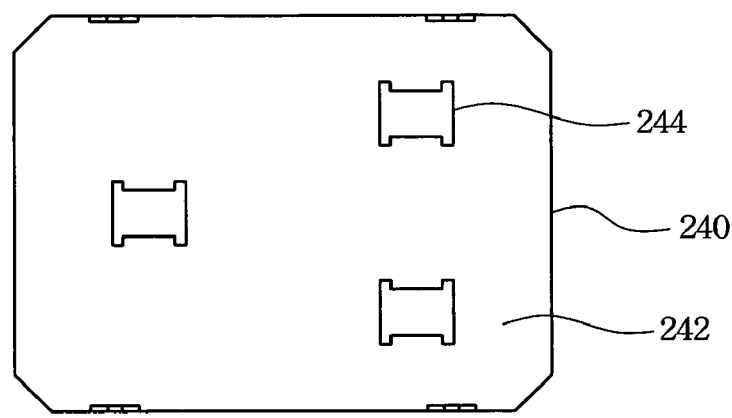
FIG. 2B is a schematic top view of a lower heat fin of the preferred embodiment of FIG. 1.
Figure 2C:
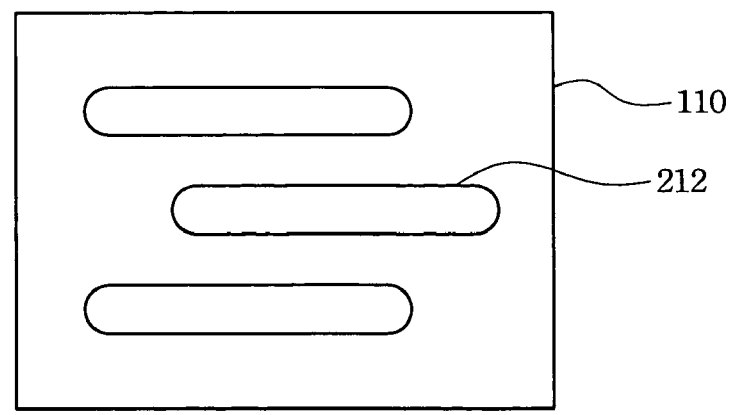
FIG. 2C is a schematic top view of the base of the preferred embodiment of FIG. 1.

FIG. 2A illustrates a schematic top view of an upper heat fin 230 perpendicular to the standing portion 122 of the L-shaped heat pipe 120. FIG. 2B illustrates a lower heat fin 240 passing through the L-shaped corner 126 and FIG. 2C illustrates the base 110. For completely transmitting the heat to the heat fins via the L-shaped heat pipe so as to fully utilize the heat dissipation capability of the heat dissipation device, the heat fins configured on the standing portion of the L-shaped pipe (referring to FIG. 1) are constructed by upper heat fins 230 of FIG. 2A and the heat fins configured on, and perpendicular to, the L-shaped corner 126 of the L-shaped pipe (also referring to FIG. 1) are constructed by lower heat fins 240 of FIG. 2B. The upper heat fins 230 are made of a material with a high thermal conductivity, and preferably a sheet metal 232, e.g. an aluminum sheet metal or a copper sheet metal, with round openings 234 for heat pipes to pass therethrough. The L-shaped heat pipe and the upper heat fins 230 are connected by a weld or glue to fix the upper heat fins 230 on the L-shaped heat pipe so as to enhance thermal conductivity therebetween. The openings 234 for fitting the exterior shape of the L-shaped heat pipe are not limited to round openings. The openings 234 can be square, oblong, or elliptic openings, or any other shaped openings to fit a corresponding L-shaped heat pipe with a square, elliptic or any other exterior shape.

Accordingly, for fitting the L-shaped corner of the heat pipe, the heat fins close to the L-shaped corner preferably adopt the lower heat fins 240. The lower heat fins 240 are also made of a material with a high thermal conductivity, similar to the upper heat fins 230, and preferably a sheet metal 242, e.g. an aluminum sheet metal or a copper sheet metal, with openings 244 for heat pipes to pass therethrough. The openings 244 for fitting the exterior shape of the L-shaped corner of the L-shaped heat pipe are not limited to oblong or rectangular openings 244. The openings 244 can be square, oblong, or elliptic openings, or any other shaped openings to fit the exterior shape of the L-shaped corner. The L-shaped heat pipe and the lower heat fins 240 are connected by a weld or glue to fix the lower heat fins 240 on the L-shaped heat pipe and enhance thermal conductivity therebetween.

Referring to FIG. 2C, the base 110 absorbs the heat generated by the heat source for transmission to the L-shaped heat pipe effectively coupled to the base 110. The base 110 is also made of a material with a high thermal conductivity, for example aluminum or copper. The base 110 further has heat pipe fixing trenches 212 for fixing the transverse portion 124, and for absorbing the heat, of the L-shaped heat pipes therein. Because the transverse portion 124 of the L-shaped heat pipe is parallel to the heat pipe fixing trench 212 of the base 110, the contact area therebetween is increased; consequently, more heat is absorbed from the base 110 and transmitted to the heat fins coupled to the L-shaped heat pipe. Accordingly, the heat dissipation efficiency of the heat dissipation device according to the present invention can be increased and each of the heat fins can be supplied with uniform heat for uniform heat dissipation. Therefore, even the heat fins coupled on an end portion of the heat pipe are also supplied with heat by the high heat dissipation efficiency L-shaped heat pipe so as to dissipate the heat effectively. Accordingly, the heat dissipation device according to the present invention provides an increased heat dissipation capability on a controlled volume thereof.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A heat dissipation device, comprising:
   a fan;
   a base disposed beside the fan;
   three L-shaped heat pipes parallel-configured on the base, each having a standing portion, a transverse portion coupled to the base and an L-shaped corner, wherein two of the three L-shaped heat pipes are disposed adjacent to the fan, and another one of the three L-shaped heat pipes is disposed between the two of the three L-shaped heat pipes and far away from the fan, so that none of the heat pipes will block a flow of air from the fan to any of the other heat pipes; and
   a plurality of heat fins coupled to the L-shaped heat pipes, wherein the base absorbs heat generated by a heat source and the heat is transmitted to the heat fins via the L-shaped heat pipes to remove the heat from the heat dissipation device.

2. The heat dissipation device of claim 1, wherein the base further comprises at least three heat pipe fixing trenches for attaching to the transverse portions of the L-shaped heat pipes, increasing contact area between the L-shaped heat pipes and the base, and enhancing the heat dissipation efficiency of the heat dissipation device.

3. The heat dissipation device of claim 1, wherein the heat fins further comprise at least one upper heat fin and at least one lower heat fin.

4. The heat dissipation device of claim 3, wherein the upper heat fin further comprises at least three round openings for the standing portions of the L-shaped heat pipes to pass therethrough.

5. The heat dissipation device of claim 3, wherein the lower heat fin further comprises at least three long openings for the L-shaped corners of the L-shaped heat pipes to pass therethrough.

6. The heat dissipation device of claim 5, wherein the long openings comprise rectangular openings.

7. The heat dissipation device of claim 5, wherein the long openings comprise oblong openings.

8. The heat dissipation device of claim 1, wherein the L-shaped heat pipes are made of a metal material with high thermal conductivity.

9. A heat dissipation device, comprising:
a fan;
a base disposed beside the fan and comprising at least three heat pipe fixing trenches;
a plurality of heat fins, parallel-configured above the base; and
three L-shaped heat pipes parallel-configured on the base and passed through the heat fins, wherein each of the three L-shaped heat pipes further comprises a standing portion, a transverse portion perpendicular to the standing portion and an L-shaped corner, each of the transverse portions is coupled to one of the heat pipe fixing trenches of the base to increase a contact area between the L-shaped heat pipes and the base for increasing a heat dissipation efficiency of the heat dissipation device, and the base absorbs heat generated by a heat source and transmits the heat to the heat fins via the L-shaped heat pipes, wherein two of the three L-shaped heat pipes are disposed adjacent to the fan, and another one of the three L-shaped heat pipes is disposed between the two of the three L-shaped heat pipes and far away from the fan, so that none of the heat pipes will block a flow of air from the fan to any of the other heat pipes.

10. The heat dissipation device of claim 9, wherein the heat fins further comprise at least one upper heat fin and at least one lower heat fin.

11. The heat dissipation device of claim 10, wherein the upper heat fin further comprises at least three round openings for the standing portions of the L-shaped heat pipes to pass therethrough.

12. The heat dissipation device of claim 10, wherein the lower heat, fin further comprises at least three long openings for the L-shaped corners of the L-shaped heat pipes to pass therethrough.

13. The heat dissipation device of claim 12, wherein the long openings comprise rectangular openings.

14. A heat dissipation device for removing a heat generated by a heat source, the heat dissipation device comprising:
a base coupling to the heat source and comprising a plurality of heat pipe fixing trenches;
a plurality of L-shaped heat pipes coupling to the base, wherein the heat pipe fixing trenches increase contact area between the base and the L-shaped heat pipes for increasing heat dissipation efficiency of the heat dissipation device;
a plurality of heat fins being parallel to the base and coupled to the L-shaped heat pipes, wherein the base absorbs the heat generated by the heat source and the heat is transmitted to the heat fins via the L-shaped heat pipes to remove the heat from the heat dissipation device; and
a fan disposed beside the base, wherein all of the L-shaped heat pipes are parallel-disposed on the base, at least one of the L-shaped heat pipes is disposed adjacent to the fan, and the others of the L-shaped heat pipes are disposed far away from the fan and are disposed so that at least one of the L-shaped heat pipes is between the far-away heat pipes, so that none of the heat pipes will block a flow of air from the fan to any of the other heat pipes.

15. The heat dissipation device of claim 14, wherein the heat fins further comprise at least one upper heat fin and at least one lower heat fin.

16. The heat dissipation device of claim 15, wherein the upper heat fin further comprises round openings for the standing portions of the L-shaped heat pipes to pass therethrough.

17. The heat dissipation device of claim 15, wherein the lower heat fin further comprises long openings for the L-shaped corners of the L-shaped heat pipes to pass therethrough.

18. The heat dissipation device of claim 17, wherein the long openings comprise rectangular openings.

19. The heat dissipation device of claim 17, wherein the long openings comprise oblong openings.

20. The heat dissipation device of claim 14, wherein the L-shaped heat pipes, the base, and the heat fins are made of a metal material with high thermal conductivity.

* * * * *